US005745514A

United States Patent [19]
Patel et al.

[11] Patent Number: 5,745,514
[45] Date of Patent: Apr. 28, 1998

[54] LASER DIODE STRUCTURE WITH INTEGRATED HEAT SINK

[75] Inventors: Rushikesh Patel; Michael Ung, both of Tucson, Ariz.

[73] Assignee: Opto Power Corporation, Tucson, Ariz.

[21] Appl. No.: 638,545

[22] Filed: Apr. 26, 1996

[51] Int. Cl.⁶ ........................................... H01S 3/18
[52] U.S. Cl. .................... 372/43; 372/34; 372/50
[58] Field of Search ................... 372/34, 36, 43, 372/48, 50

[56] References Cited

U.S. PATENT DOCUMENTS

| | | | |
|---|---|---|---|
| 4,546,478 | 10/1985 | Shimizu et al. | 372/36 |
| 5,052,009 | 9/1991 | Tsuboi et al. | 372/36 |
| 5,197,076 | 3/1993 | Davis et al. | 372/34 |
| 5,285,462 | 2/1994 | Kasahara | 372/36 |
| 5,408,493 | 4/1995 | Aoki | 372/107 |

OTHER PUBLICATIONS

Modular Microchannel Cooled Heatsink for High Average Power Laser Diod Arrays R. Beach et al, IEEE Journal of Quantu Electronics, Jun. 1991.

*Primary Examiner*—Brian Healy
*Attorney, Agent, or Firm*—Herbert M. Shapiro

[57] ABSTRACT

A laser diode structure includes a metallic gasket which is sandwiched between the laser diode submount and the backside electrode in the absence of solder interfaces. The gasket has mirror image, shallow recesses in the surfaces thereof with each surface having the general shape of a wing. The recesses are formed into sealed coolant conduits when the several layers are bonded together into an integrated structure. The narrow end of each recess communicates with an aperture through the adjacent layer to provide inlet and outlet ports for the coolant. The gasket has an aperture therethrough at the wide ends of the recesses for the coolant to circulate. The gasket can be formed from a single layer or from two layers each with a single recess.

10 Claims, 4 Drawing Sheets

LASER DIODE STRUCTURE WITH INTEGRATED HEAT SINK

FIELD OF THE INVENTION

This invention relates to laser diodes and more particularly to such a diode with an integrated heat sink.

BACKGROUND OF THE INVENTION

Laser diode structures with integrated heat sinks are commercially available. One such arrangement employs an integrated "microchannel cooler". Such a heatsink is constructed by juxtaposing a planar silicon wafer against the familiar metallized beryllium oxide laser diode substrate. The planar silicon wafer includes a pattern of etched grooves in the surface facing the laser substrate. First and second holes through the silicon wafer provide the coolant inlet and outlet ports for circulating coolant in the channels defined by the etched grooves and the juxtaposed laser substrate. The channels provide the laminar flow for the coolant which is thought necessary for efficient heat removal.

Another laser diode structure with an integrated heat sink is described in the IEEE Journal of Quantum Electronics, June 1991 in an article entitled "Modular Microchannel Cooled Heatsinks For High Average Power Laser Diode Arrays" by R. Beach et al. The heatsink provides for laminar flow of the coolant by employing two planar silicon layers which sandwich a glass layer between them. A first of the silicon layers has a coolant inlet port which communicates with a ribbed pattern on the upper surface of the layer. The ribbed pattern flares out from the inlet port and stops short of a position in registry with the position of an adjacent laser diode substrate.

The second silicon layer has an outlet port which communicates with a corresponding ribbed pattern on it's underside and which also stops short of the laser diode position. The ribbed structure mirrors that of the first silicon wafer and is designed to gather the coolant into the outlet port for recirculation.

The glass layer has an aperture in a position where the ribbed patterns flare out to permit movement of the coolant from the inlet to the outlet port and to spread out the coolant at the position of the laser diode before being collected for recirculation, thus providing laminar flow at the position of the diode.

Both of the above described structures require silicon layers and etching with photolithographic techniques to produce the ribbed patterns and, thus, are quite costly. Further each of the above structures is characterized by several solder interfaces which bond the several layers of the structure into an integrated whole. Each interface, in turn, represents an impediment to heat flow and, thus, results in a reduction in the efficiency of the heat removal system.

BRIEF DESCRIPTION OF THE INVENTION

In accordance with the principles of this invention, a planar metallic gasket is sandwiched between the Tungsten Copper Alloy substrate on which a laser diode is mounted and a Tungsten Copper alloy (or metal) layer which serves as a backside electrode. The layers are connected into an integrated structure with only one solder interface by heating the structure under pressure thus avoiding the many heat flow-resisting interfaces characteristic of prior art laser diode heat structures. The gasket fulfills the heat sink function by forming a shallow, generally wing-shaped recess in each of it's surfaces. Each recess has a wide end with a width approximating the width of the laser diode to be cooled. The recesses are mirror images of one another and the gasket includes an aperture at the wide end of the recesses to permit coolant to move from an inlet port connected to one of the recesses to an outlet port connected to the other recess. The gasket provides for highly efficient cooling of the integrated laser diode structure which has only a single solder interface which occurs at the point where the laser diode is soldered to the Tungsten Copper alloy substrate.

In another embodiment, the gasket is formed from two metal layers, each having a shallow recess in one of it's surfaces and an aperture through the layer at the wide end of the recess. The two layers are attached to one another when the entire structure is heated under pressure to form an integrated structure.

DETAILED DESCRIPTION OF ILLUSTRATIVE EMBODIMENTS OF THIS INVENTION

Figure 1:
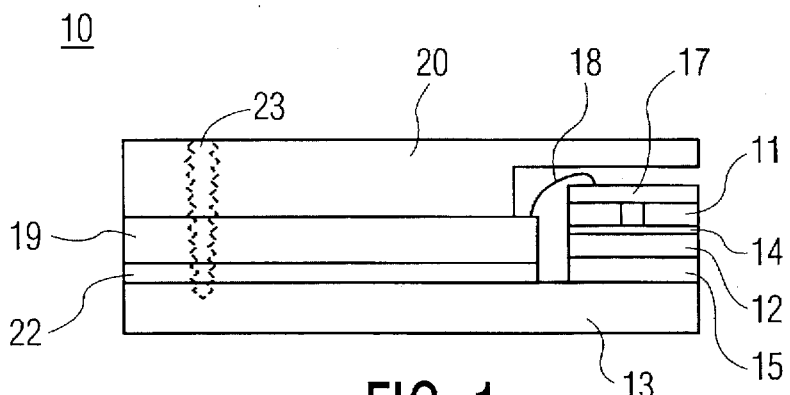
FIG. 1 is a schematic side view of a prior art integrated laser diode-heatsink structure.

FIG. 1 shows a prior art integrated laser diode-heatsink structure 10. The structure includes a laser diode 11 on a Tungsten Copper alloy (substrate) submount 12 and integrated with a heatsink 13. The structure also includes solder layers 14 and 15 which bond diode 11 to submount 12 and bond submount 12 to heatsink 13, respectively. Metal layer 17 serves as a bonding pad for wire 18 which connects the diode to Aluminum oxide stand off member 19. Cover 20 is connected to member 19 and heatsink 13 by means of screw 23.

Heatsink 13 comprises a solid Copper block and is maintained at a positive potential. Cover 20 is maintained at a negative potential for biasing diode 11 for laser action.

Figure 2:
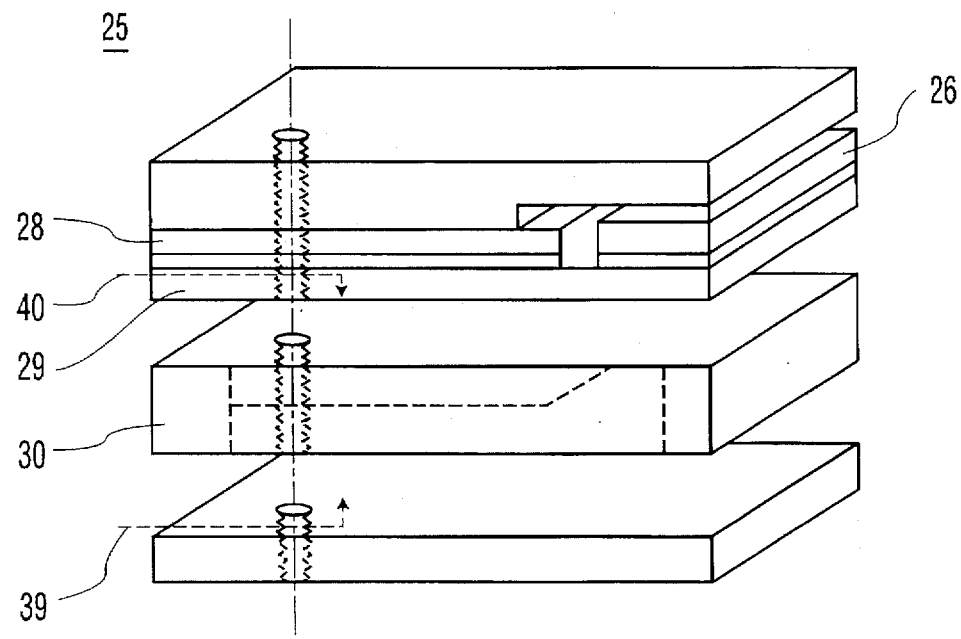
FIG. 2 is an exploded, schematic view of an integrated laser diode-heatsink structure in accordance with the principles of this invention.

FIG. 2 shows an exploded view of an integrated laser diode-heatsink 25 in accordance with the principles of this invention. The structure is similar to that of FIG. 1, including laser diode 26, Aluminum oxide stand off member 28, submount 29 and heatsink 30. But, heatsink 30 comprises a metal gasket which has recesses formed (i. e. by embossing) as well as an aperture which connects the two recesses.

Figure 3:
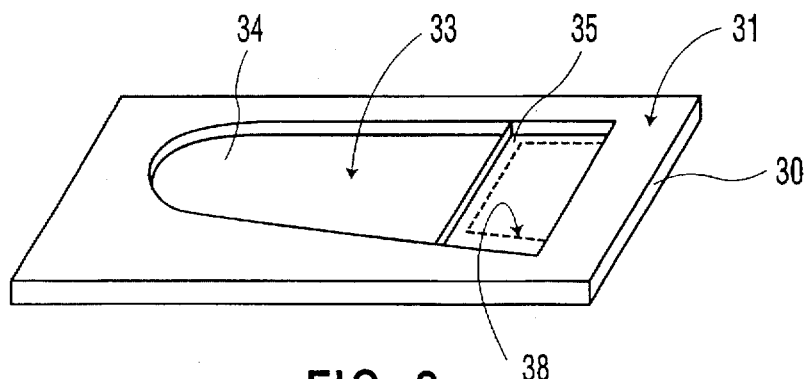
FIGS. 3 and 4 are top and bottom views of a portion of the structure of FIG. 2.
Figure 4:
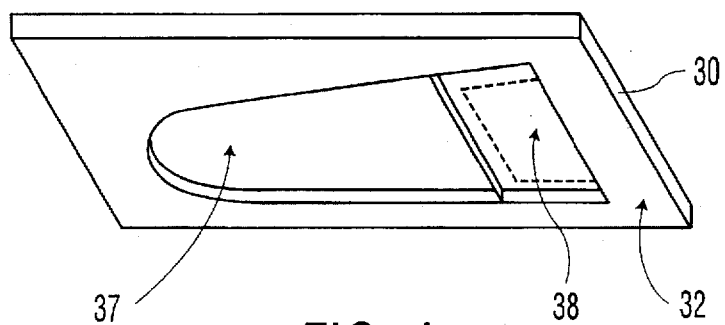

FIGS. 3 and 4 show the top and bottom surfaces 31 and 32, respectively, of the gasket. Specifically, top surface 31 has, illustratively, a wing-shaped recess 33 formed in it. The recess has a narrow end 34 and a wide end 35. The bottom surface, similarly, has a wing-shaped recess 37 which is the mirror image of recess 33. Heatsink 30 also has an aperture 38 which connects recess 33 and 37 at the wide end. The aperture is positioned in registry with the position of diode 26 as is clear from the figures. The recesses also are connected to inlet and outlet channels at the small end of the recesses to permit recirculation of the coolant. The conduits are indicated by arrows 39 and 40.

The various layers are placed in juxtaposition and heated under pressure to form metal-metal bonds. The structure of FIGS. 2 through 4 provides for efficient cooling of a laser diode without the need for silicon or expensive etching processing and does so without laminar flow of the coolant.

Figure 5:
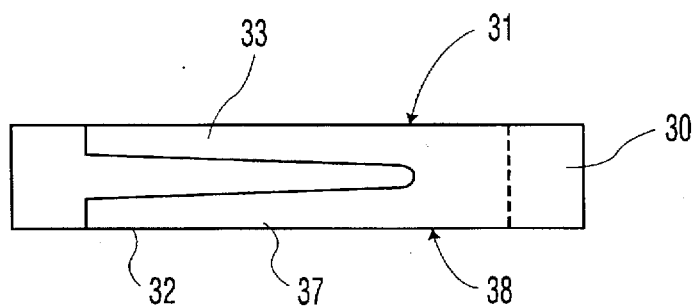
FIG. 5 is a schematic side view of a single layer implementation of the portion of FIG. 2 shown in FIGS. 3 and 4.

In the embodiment of FIGS. 3 and 4, a single gasket was used. FIG. 5 shows a schematic cross section of a single gasket implementation. Of course, separate gaskets could be used instead. In such a case, FIGS. 2 and 3 may be taken to represent two different gaskets.

Figure 6:
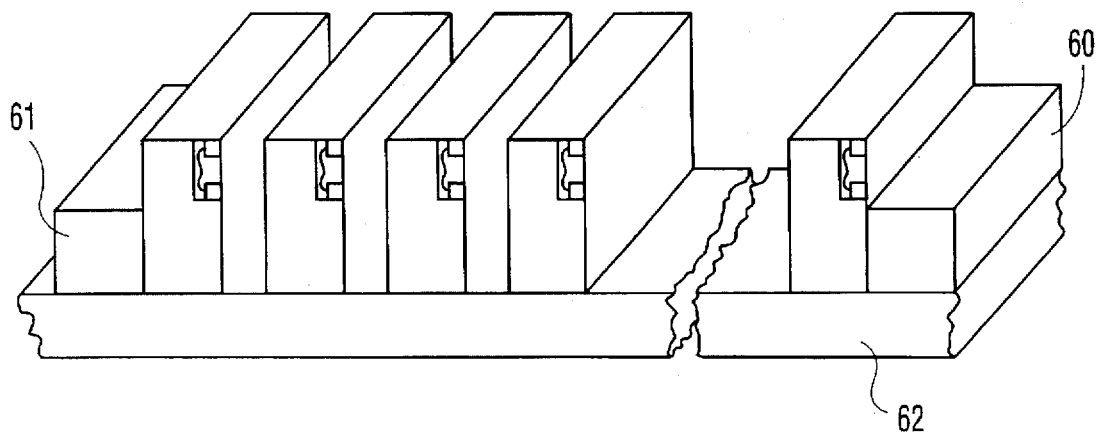
FIG. 6 is a schematic view of a stack of structures of the type shown in FIGS. 2 through 5.

FIG. 6 shows a stack of diode structures which may be implemented with the structures of FIG. 2. The stack is secured in place by brackets 60 and 61 on a support 62 for providing a linear array of diodes.

Figure 7:
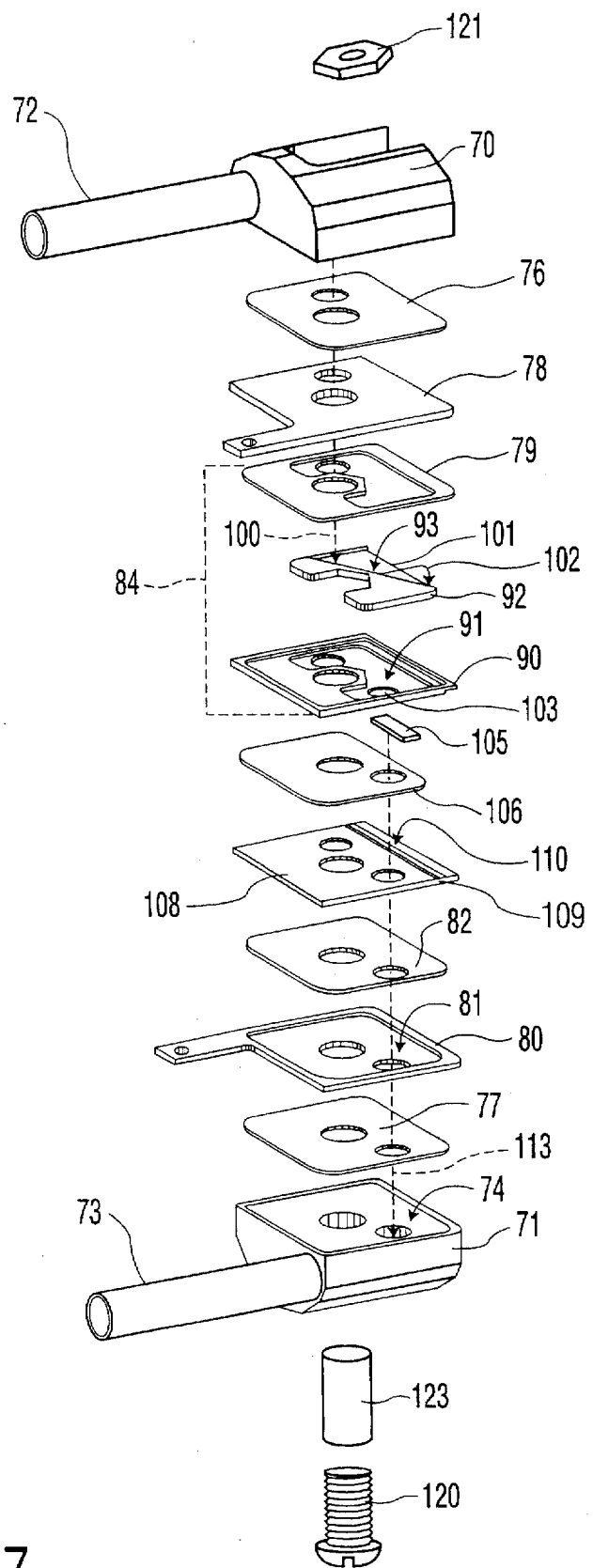
FIGS. 7 and 8 are exploded and assembled views of a practical embodiment of this invention.
Figure 8:
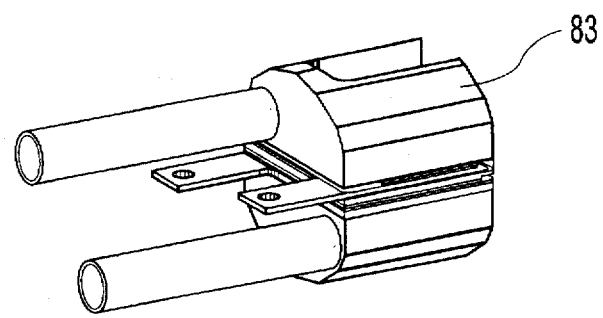

FIGS. 7 and 8 show an exploded and an assembled view of a practical embodiment of this invention. The embodiment comprises a pair of brass end members 70 and 71 with water inlet and outlet ports 72 and 73. Each block has a recess (74) shown only for block 71. The recesses are configured to receive silicone gaskets 76 and 77 as shown. A brass electrode 78 is juxtaposed with gasket 76. Electrode 78 has a recess in its underside adapted to receive a silicone gasket 79. The recess and gasket are illustrated for electrode 80 and are designated 81 and 82 respectively.

The single (or plural) laser diode and heatsink in accordance with the principles of this invention are contained in the laminate structure which is sandwiched between end members 70, with gasket 76 in place, and member 71 with gasket 77 in place. The assembled view is designated 83 in FIG. 8.

Figure 9:
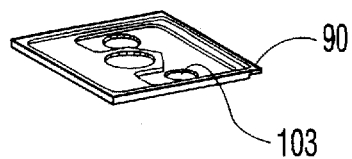
FIGS. 9 and 10 are schematic views of portions of the embodiment of FIGS. 7 and 8.

The heatsink portion of the embodiment of FIGS. 7 and 8 is indicated by the broken line 84 so designated in FIG. 7. The heatsink comprises a planar Tungsten Copper alloy member 90 with a recess 91 adapted to receive a copper manifold 92 shown also in FIGS. 9 and 10. Copper manifold 92 has water conduit area, generally wing shaped, formed in each surface and which are mirror images of one another. These recesses are designated 93 and 94, the latter being shown in the underside view of manifold 92 shown in FIG. 10.

As is clear from the FIGS. 7 through 10, that water introduced at port 72 in FIG. 7 flows through a set of aligned apertures into recess 93 as indicated by broke arrow 100 of FIG. 7.

Figure 10:
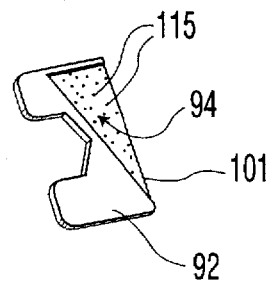

The water flows over the edge 101 of the manifold as shown in FIG. 10 as shown by curved arrow 102 in FIG. 7 to be collected by recess 94 into aperture 103 for movement to outlet port 73 of FIG. 7.

A laser diode (or diodes) is represented as a rectangular component designated 105 in FIG. 7 and can be seen juxtaposed with Tungsten Copper alloy member 90 along with spacing element 106. Spacing element 106 mates with submount element 108, with ridge 109, to provide a electrical contact 110 for the diode. The water exiting through aperture 103 follows a path indicated by broken arrow 113 to outlet port 73.

The structure of FIGS. 7 and 8 has the significant advantage of having no solder layer between the components except for the diode(s) and the heatsink and satisfactory levels of cooling have been achieved in prototype devices of the type shown in FIG. 7. Significant increases in cooling levels have been achieved by adding pedestals or otherwise roughing up the surface of recess 93 (and/or 94) of manifold 90 of FIG. 7. Such roughening causes turbulence to the water flow which has been found to increase heat conduction in the device of FIG. 7. Such roughening is indicated by dots 115 in FIG. 10.

The device of FIG. 7 conveniently may be positioned at the end of an umbilical cord (not shown) which includes tubes for water conduction and electrical connections to electrodes 78 and 80. Further, the device could include multiple components like 84 of FIG. 7 each with an associated laser diode (or diodes to form a stack similar to that as shown in FIG. 6).

The assembly of FIGS. 7 and 8 is held together by screw 120 and nut 121 inserted along with electrically insulating sleeve 123 into the central apertures (undesignated) in the various components.

In one specific embodiment, a stack of diode arrays generated 130 watts of optical power when operated continuous wave at 65 amps. current and 6.3 volts. The heat generated was approximately 280 watts. Two diodes were mounted on a Tungsten Copper alloy submount having dimensions of of 2.54 cm×1.5 cm. The diode junnction pitch in the vertical direction of the stack was 2.0 cm. Average power density attained in this package was 1.6 W/cm$^2$. Silicone gaskets 0.5 mm thick were used. A Nickel plated Copper manifold with 0.4 mm deep channels was used. The coolant was water and the flow was two liters per minute with the coolant temperature being 15 degrees centigrade. The positive and negative electrodes were made of 1.0 mm thick Gold plated Copper.

The various materials and dimensions used herein are only illustrative. Alternatives for such materials and dimensions are familiar to those skilled in the art and are determined by the intended use of the diodes as well as the requisite drive and power requirements.

What is claimed is:

1. A laser diode structure, said structure including first, second and third planar layers, said first layer comprising a laser diode, said third layer comprising an electrode, said second layer comprising a metallic gasket and being sandwiched between said first and third layers, said second layer having first and second surfaces having first and second shallow recesses therein respectively, each of said recesses having a wide and a narrow end, said second layer having an aperture therethrough at said wide ends for connecting said first and second recesses, said first, second and third layers comprising an integrated structure, said first and third layers having coolant inlet and outlet ports therethrough in registry with said narrow ends of associated ones of said recesses.

2. A laser diode structure as in claim 1 wherein said second layer comprises first and second sublayers each having a single recess on one face thereof and an aperture therethrough in registry with the wide end of said recess.

3. A laser diode structure as in claim 1 wherein said first and second recesses are mirror images of one another.

4. A laser diode structure as in claim 2 wherein said first and second recesses are mirror images of one another.

5. A laser diode structure including a metallic gasket having first and second surfaces with first and second shallow recesses formed in said surfaces respectively, each of said recesses having a narrow end and a wide end, said gasket having a hole therethrough at said wide ends, said gasket being sandwiched between first and second planar layers for forming an integrated structure, said first and second layers having coolant inlet and outlet ports therethrough in registry with said narrow ends of associated ones of said recesses.

6. A laser diode structure as in claim 5 wherein said first and second recesses are mirror images of one another with the wide ends thereof in registry with one another.

7. A laser diode structure as in claim 5 wherein said first and second layers comprise a submount and a backside electrode in an integrated structure, said submount and said backside electrode having apertures therethrough in registry with the narrow end of the facing one of said first and second recesses for providing coolant inlet and outlet ports.

8. A laser diode structure as in claim 7 wherein said gasket is composed of two sublayers each having a recess in the surface thereof and an aperture at the wide end of the recess.

9. A plurality of laser diode structures as in claim 7 organized in a stack and secured in place to form a linear array of diodes.

10. A plurality of laser diode structures as in claim 8 organized in a stack and secured in place to form a linear array of diodes.

* * * * *